United States Patent
Shin

(10) Patent No.: US 10,318,167 B2
(45) Date of Patent: Jun. 11, 2019

(54) MEMORY SYSTEM AND METHOD FOR CONTROLLING OPERATION BASED ON READ NUMBER

(71) Applicant: SK hynix Inc., Gyeonggi-do (KR)

(72) Inventor: Soong-Sun Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/473,928

(22) Filed: Mar. 30, 2017

(65) Prior Publication Data

US 2018/0046370 A1 Feb. 15, 2018

(30) Foreign Application Priority Data

Aug. 10, 2016 (KR) .................. 10-2016-0101687

(51) Int. Cl.
| | |
|---|---|
| *G06F 3/06* | (2006.01) |
| *G11C 16/04* | (2006.01) |
| *G11C 16/26* | (2006.01) |
| *G11C 16/30* | (2006.01) |
| *G11C 16/34* | (2006.01) |

(52) U.S. Cl.
CPC .............. *G06F 3/061* (2013.01); *G06F 3/065* (2013.01); *G06F 3/0659* (2013.01); *G06F 3/0679* (2013.01); *G11C 16/26* (2013.01); *G11C 16/30* (2013.01); *G11C 16/3427* (2013.01); *G11C 16/3495* (2013.01); *G11C 16/0483* (2013.01)

(58) Field of Classification Search
CPC ........ G06F 3/061; G06F 3/065; G06F 3/0659; G06F 3/0679
See application file for complete search history.

(56) References Cited

U.S. PATENT DOCUMENTS

| | | | | |
|---|---|---|---|---|
| 2013/0138871 | A1* | 5/2013 | Chiu | ............ G06F 12/0246 711/103 |
| 2015/0043282 | A1* | 2/2015 | Shin | ............ G11C 16/3495 365/185.21 |
| 2015/0113341 | A1 | 4/2015 | Frost et al. | |
| 2015/0199268 | A1* | 7/2015 | Davis | ............ G06F 12/0246 711/103 |

FOREIGN PATENT DOCUMENTS

| | | |
|---|---|---|
| KR | 1020090066691 | 6/2009 |
| KR | 1020100003244 | 1/2010 |
| KR | 1020150131948 | 11/2015 |

* cited by examiner

*Primary Examiner* — Aracelis Ruiz
(74) *Attorney, Agent, or Firm* — IP & T Group LLP

(57) ABSTRACT

A memory system includes: a memory device; and a controller suitable for controlling the memory device, wherein the controller performs a read operation in a first region of the memory device in response to a read command from a host, and sets a second region of the memory device, into which data stored in the first region is to be copied, based on a read number of the first region.

18 Claims, 8 Drawing Sheets

MEMORY SYSTEM AND METHOD FOR CONTROLLING OPERATION BASED ON READ NUMBER

CROSS-REFERENCE TO RELATED APPLICATIONS

This U.S. non-provisional patent application claims priority under 35 U.S.C. § 119(a) to Korean Patent Application No. 10-2016-0101687, filed on Aug. 10, 2016 in the Korean Intellectual Property Office (KIPO), the disclosure of which is incorporated herein by reference in its entirety.

BACKGROUND

1. Field

Exemplary embodiments of the present invention relate generally to a memory system including a memory device and an operating method thereof.

2. Description of the Related Art

The computer environment paradigm has changed to ubiquitous computing systems that can be used anytime and anywhere. Due to this, use of portable electronic devices such as mobile phones, digital cameras, and notebook computers has increased rapidly. These portable electronic devices generally use a memory system having one or more memory devices for storing data. A memory system may be used as a main memory device or an auxiliary memory device for a portable electronic device.

Memory systems using memory devices provide excellent stability, durability, high information access speed, and low power consumption, since they have no moving parts. Examples of memory systems having such advantages include universal serial bus (USB) memory devices, memory cards having various interfaces, and solid state drives (SSD).

SUMMARY

Various embodiments are directed to an improved memory system exhibiting reduced complexity, enhanced performance, and enhanced use efficiency of a memory device included therein. The memory system may more rapidly and stably process data to and from the memory device. The invention is also directed to an improved operating method of the memory system.

In an embodiment, a memory system may include: a memory device; and a controller suitable for controlling the memory device. The controller may perform a read operation in a first region of the memory device in response to a read command from a host, and may set a second region of the memory device, into which data stored in the first region is to be copied, based on a read number of the first region.

The controller may compare the read number of the first region to a predetermined threshold number, and determines whether to set the second region.

When the controller determines to set the second region, the controller may generate a copy command for copying the data of the first region into the second region.

When the memory device is switched to a standby state, the controller may copy the data of the first region into the second region, based on the copy command.

The first region may include a primary region to which data are written in response to a request from the host or one or more secondary regions to which data are copied and written in response to the copy command.

After the data of the first region are copied into the second region, the controller may set the second region to a secondary region of the first region, and may perform the read operation in the primary region of the first region or one or more of the secondary regions of the first region in response to a read command for the first region, the read command being provided from the host.

When the read number of the first region is equal to or greater than the threshold number, the controller may set the second region.

The threshold number may be set according to the number of program/erase cycles in the first region.

The threshold number may be set to be smaller than the limit number at which the read operation for the first region is disturbed.

The read number of the first region may be set based on a workload of the first region.

In an embodiment, an operating method of a memory system including a memory device, may include: performing a read operation in a first region of the memory device in response to a read command from a host; and setting a second region of the memory device, into which data stored in the first region are to be copied, based on a read number of the first region.

The setting of the second region may include comparing the read number of the first region to a predetermined threshold number, and determining whether to set the second region.

The operating method may further include generating a copy command for copying the data of the first region into the second region, when the setting of the second region is determined at the setting of the second region.

The operating method may further include copying the data of the first region into the second region based on the copy command, when the memory device is switched to a standby state.

The first region may include a primary region to which data are written in response to a request from the host or one or more of secondary regions to which data are copied and written through the copying of the data.

The operating method may further include setting the second region to a secondary region of the first region, and performing the read operation in the primary region of the first region or one or more of the secondary regions of the first region in response to a read command for the first region, the read command being provided from the host, after the copying of the data.

The setting of the second region may include setting the second region, when the read number of the first region is equal to or greater than the threshold number.

The threshold number may be set according to the number of program/erase cycles in the first region.

The threshold number may be set to less than the limit number at which the read operation for the first region is disturbed.

The read number of the first region may be set based on a workload of the first region.

In an exemplary embodiment of the present invention, an operating method of a memory system may include: providing a controller and a nonvolatile memory device coupled to the controller; determining a read number of a first region of the nonvolatile memory device; and copying data of the first region into a second region of the nonvolatile memory device, when the read number is equal to or greater than a threshold number. The predetermined number may be set according to the number of program/erase cycles in the first region.

BRIEF DESCRIPTION OF THE DRAWINGS

These and other features and advantages of the present invention will become apparent to those skilled in, the art to which the present invention pertains from the following detailed description of various embodiments of the present invention in reference to the accompanying drawings, wherein.

DETAILED DESCRIPTION

Figure 1:
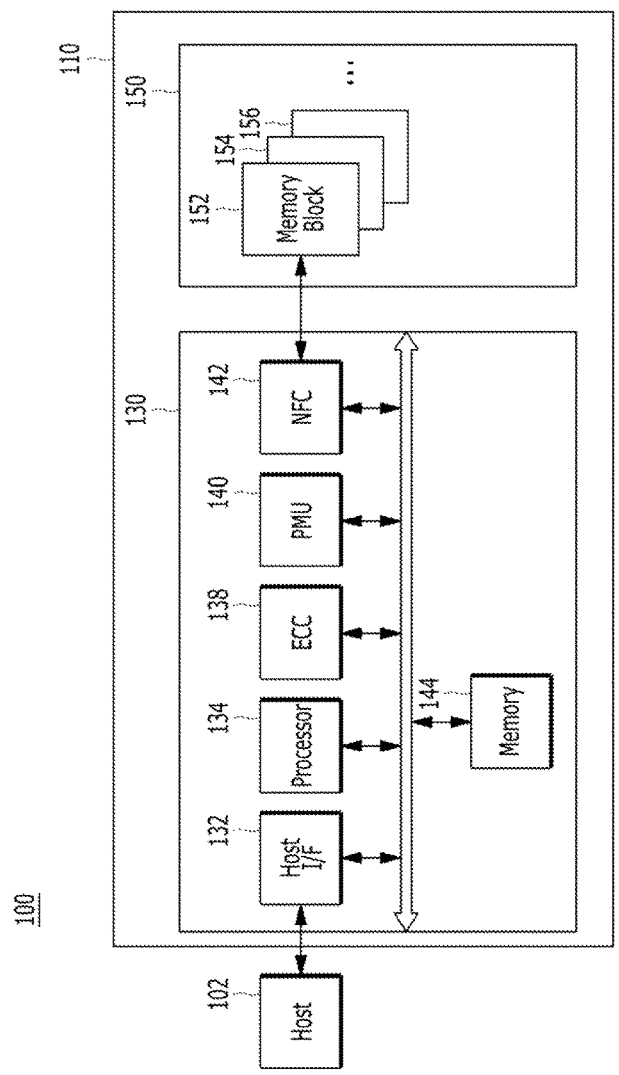
FIG. 1 is a diagram illustrating a data processing system including a memory system, according to an exemplary embodiment of the present invention.

Although, various embodiments are described below in more detail with reference to the accompanying drawings, we note that the present invention may, however, be embodied in different forms and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to" or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art, to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

FIG. 1 illustrates a data processing system 100 including a memory system 110, according to an exemplary embodiment of the present invention.

Referring to FIG. 1, the data processing system 100 may also include a host 102 operatively coupled to the memory system 110.

The host 102 may be any suitable electronic device, including, for example, a portable electronic device such as a mobile phone, an MP3 player and a laptop computer or a non-portable electronic device such as a desktop computer, a game player, a television (TV) and a projector.

The memory system 110 may operate in response to a request from the host 102. For example, the memory system 110 may store data which may be accessed by the host 102. The memory system 110 may be used as a main memory or an auxiliary memory of the host 102. The memory system 110 may be implemented with any one of various storage devices, according to the protocol of a host interface to be coupled electrically with the host 102. The memory system 110 may be implemented with any one of various storage devices, such as, for example, a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

The storage devices forming the memory system 110 may be implemented with a volatile memory device, such as, a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase-change RAM (PRAM), a magnetoresistive RAM (MRAM), a resistive RAM (RRAM) and a flash memory.

The memory system 110 may include a memory device 150 and a controller 130. The memory device 150 may store data to be accessed by the host 102, and the controller 130 may control data exchange between the memory device 150 and the host 102. Under the control of the controller 130, data received from the host 102 may be stored in the memory device 150.

The controller 130 and the memory device 150 may be integrated into one semiconductor device. For instance, the controller 130 and the memory device 150 may be integrated into one semiconductor device to form a solid state drive (SSD). When the memory system 110 is used as an SSD, the operation speed of the host 102 that is electrically coupled with the memory system 110 may be significantly increased.

The controller 130 and the memory device 150 may be integrated into one semiconductor device to form a memory card, such as, for example, a Personal Computer Memory Card International Association (PCMCIA) card, a compact flash (CF) card, a smart media card (SMC), a memory stick, a multimedia card (MMC), an RS-MMC, a micro-MMC, a secure digital (SD) card, a mini-SD, a micro-SD, an SDHC, and a universal flash storage (UFS) device.

For instance, the memory system 110 may be configured as a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage for a data center, a device capable of transmitting and receiving information under a wireless environment, one of various electronic devices for a home network, one of various electronic devices for a computer network, one of various electronic devices for a telematics network, an RFID device, or one of various component elements for a computing system.

The memory device 150 may retain stored data even when power is blocked, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells electrically coupled to a word line (WL). The memory cells may be single bit cells or multi-bit cells. The memory cells may be arranged in a two-dimensional or a three-dimensional stacked structure. The memory device 150 may be a nonvolatile memory device, for example, a flash memory. The flash memory may have a three-dimensional (3D) stack structure. The structure of the memory device 150 and the three-dimensional (3D) stack structure of the memory device 150 will be described later in detail with reference to FIGS. 2 to 4.

The controller 130 of the memory system 110 may control the memory device 150 in response to a request received from the host 102. For example, the controller 130 may provide data read from the memory device 150 to the host 102, and store the data provided from the host 102 into the memory device 150. To this end, the controller 130 may control the overall operations of the memory device 150 such as read, write, program, and erase operations.

As illustrated in the embodiment of FIG. 1, the controller 130 may include a host interface (I/F) unit 132, a processor 134, an error correction code (ECC) unit 138, a power management unit (PMU) 140, a NAND flash controller (NFC) 142, and a memory 144.

The host interface unit 132 may process commands, addresses and data received from the host 102 and transmit them the various components of the controller 130 as may be needed via an internal bus. The host interface unit 132 may also provide data read from the memory device 150 to the host 102. The host interface unit 132 may communicate with the host 102 through any suitable interface protocol including at least one of a universal serial bus (USB), a multimedia card (MMC), a peripheral component interconnect-express (PCI-E), a serial attached SCSI (SAS), a serial advanced technology attachment (SATA), a parallel advanced technology attachment (PATA), a small computer system interface (SCSI) an enhanced small disk interface (ESDI), and an integrated drive electronics (IDE).

The ECC unit 138 may determine and correct errors in the data read from the memory device 150 during a read operation. The ECC unit 138 may not correct error bits when the number of the error bits is greater than a threshold number of correctable error bits, and may output an error correction fail signal indicating failure in correcting the error bits.

The ECC unit 138 may perform an error correction operation based on any suitable method included a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM) and so on. The ECC unit 138 may include all circuits, systems or devices for the error correction operation.

The PMU 140 may provide and manage power for the controller 130, that is, power for the component elements included in the controller 130.

The NEC 142 may serve as a memory interface between the controller 130 and the memory device 150 to allow the controller 130 to control the memory device 150 in response to a request from the host 102. The NFC 142 may generate control signals for the memory device 150 and process data under the control of the processor 134 when the memory device 150 is a flash memory and, in particular, when the memory device 150 is a NAND flash memory. Any other suitable memory interface may be employed as needed when the memory device is other than a NAND flash memory.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with volatile memory such as a static random access memory (SRAM) or a dynamic random access memory (DRAM). As described above, the memory 144 may store data used by the host 102 and the memory device 150 for the read and write operations. For such storage of the data, the memory 144 may include a program memory, a data memory, a write buffer, a read buffer, a map buffer, and so forth.

The processor 134 may control the general operations of the memory system 110, and a write operation or a read operation for the memory device 150, in response to a write request or a read request from the host 102. The processor 134 may drive firmware, which is referred to as a flash translation layer (FTL), to control the general operations of the memory system 110. The processor 134 may be implemented, for example, with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Bad blocks due to a program fail may seriously deteriorate the utilization efficiency of the memory device 150 having a 3D stack structure and the reliability of the memory system 100. Thus reliable bad block management is typically employed in such memory systems.

Figure 2:
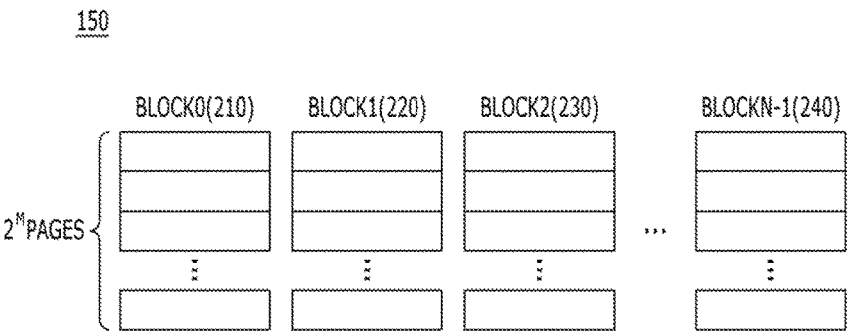
FIG. 2 is a diagram illustrating an exemplary configuration of a memory device employed in the memory system of FIG. 1.

FIG. 2 is a diagram of the memory device 150 shown in FIG. 1.

Referring to FIG. 2, the memory device 150 may include a plurality of memory blocks, for example, a zeroth memory block (BLOCK0) 210, a first memory block (BLOCK1) 220, a second memory block (BLOCK2) 230 and an N-1$^{th}$ memory block (BLOCKN-1) 240. Each of the memory blocks 210 to 240 may include a plurality of pages, for example, $2^M$ number of pages ($2^M$ PAGES). Each of the pages may include a plurality of memory cells electrically coupled to a word line.

Also, the memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. The MLC memory block including a plurality of pages which are implemented with memory cells that are each capable of storing 3-bit data may be defined as a triple level cell (TLC) memory block.

Each of the memory blocks 210 to 240 may store the data provided from the host 102 during a write operation, and provide the stored data to the host 102 during a read operation.

Figure 3:
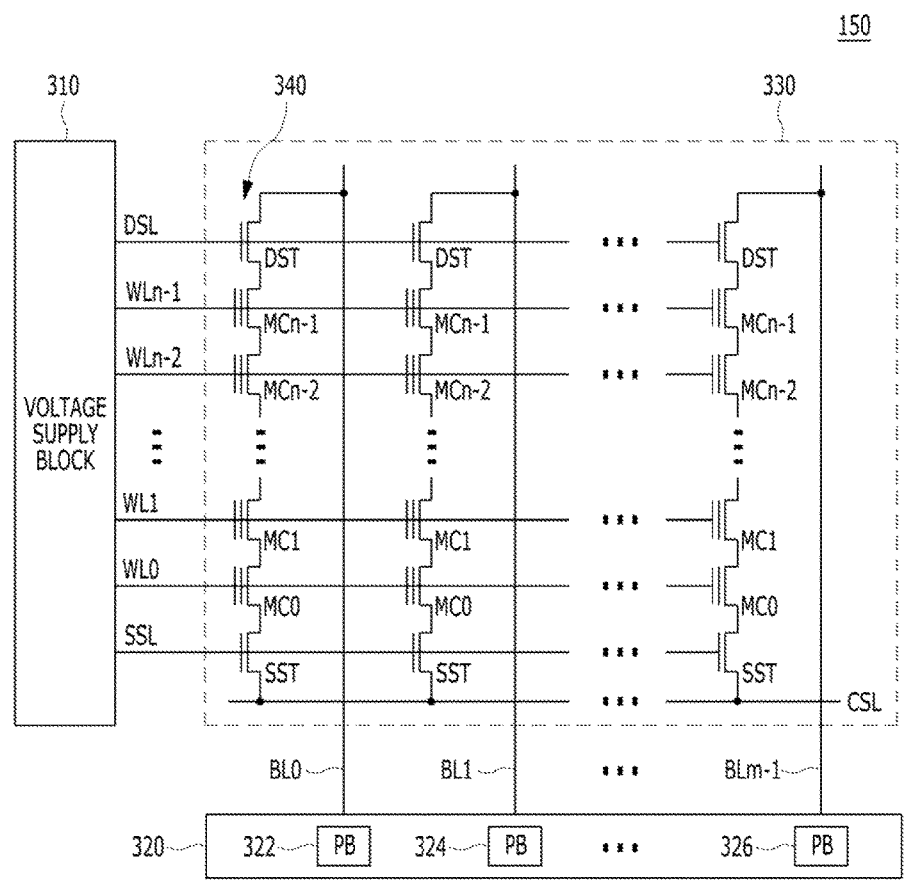
FIG. 3 is a circuit diagram illustrating a memory block in a memory device, according to an exemplary embodiment of the present invention.

FIG. 3 is a diagram illustrating a memory device 150 of FIG. 2 including a memory block. FIG. 3 shows a configuration of a single memory block 330 and circuits related thereto 310 and 320.

Referring to FIG. 3, the memory block 330 may include a plurality of cell strings 340 which are electrically coupled to a plurality of corresponding bit lines BL0 to BLm-1.

Specifically, each cell string 340 is electrically coupled to a bit line. Each cell string 340 may include at least one drain select transistor (i.e., string select transistor) DST and at least one source select transistor (i.e., a ground select line) SST. A plurality of memory cell transistors MC0 to MCn-1 may be electrically coupled in series between the select transistors SST and DST. The respective memory cells MC0 to MCn-1 may be configured by single bit each of which stores data information of a single bit or by multi-level cells (MLC) each of which stores data information of a plurality of bits. The cell strings 340 may be electrically coupled to the corresponding bit lines BL0 to BLm-1, respectively. The cell strings 340 may extend vertically and may be spaced apart at a regular interval in a horizontal direction. For reference, in FIG. 3, 'DSL' denotes a drain select line (i.e., a string select line), 'SSL' denotes a source select line (i.e., a ground select line), and 'CSL' denotes a common source line. It is noted that the aforementioned configuration is just one example of a possible configuration of a memory block of the memory device 150. It is understood that the present invention is not limited in this configuration and that many other memory block configurations may be employed.

Also, while FIG. 3 shows, as an example, the memory block 330 which is configured by NAND flash memory cells, it is to be noted that the memory block 330 of the memory device 150 according to an exemplary embodiment of the present invention is not limited to NAND flash memory and may be realized, for example, by NOR flash memory, hybrid flash memory in which at least two kinds of memory cells are combined, or one-NAND flash memory in which a controller is built in a memory chip. Furthermore, the operational characteristics of a semiconductor device may be applied to not only a flash memory device in which a charge storing layer is configured by conductive floating gates but also a charge trap flash (CTF) in which a charge storing layer is configured by a dielectric layer.

A voltage supply block 310 of the memory device 150 may provide word line voltages, for example, a program voltage, a read voltage and a pass voltage, to be supplied to respective word lines according to an operation mode and voltages to be supplied to bulks, for example, well regions, where the memory cells are formed. The voltage supply block 310 may be operatively coupled to a power source, for example, the PMU unit 140 of the controller 130 or may be coupled directly to a power source of the host 102. The voltage supply block 310 may perform a voltage generating operation under the control of a control circuit (not shown). The voltage supply block 310 may generate a plurality of variable voltages as may be needed for the various operations of the memory device. For example, the voltage supply block 310 may generate a plurality of variable read voltages for generating a plurality of read data, selecting one of the memory blocks or sectors of a memory cell array under the control of the control circuit, selecting one of the word lines of the selected memory block, and providing the word line voltages to the selected word line and the unselected word lines.

A read/write circuit 320 of the memory device 150 may be controlled by the control circuit, and may serve as a sense amplifier or a write driver according to an operation mode. During a verification/normal read operation, the read/write circuit 320 may serve as a sense amplifier for reading data from the memory cell array. Also, during a program operation, the read/write circuit 320 may serve as a write driver which drives bit lines according to data to be stored in the memory cell array. The read/write circuit 320 may receive data to be written in the memory cell array, from a buffer (not shown), during the program operation, and may drive the bit lines according to the inputted data. To this end, the read/write circuit 320 may include a plurality of page buffers (PBs) 322, 324 and 326 respectively corresponding to, columns (or bit lines) or pairs of columns (or pairs of bit lines), and a plurality of latches (not shown) may be included in each of the page buffers (PBs) 322, 324 and 326.

The memory device 150 may be realized as a 2-dimensional or 3-dimensional memory device. For example, as shown in FIG. 4, in the case where the memory device 150 is realized as a 3-dimensional nonvolatile memory device, the memory device 150 may include a plurality of memory blocks BLK0 to BLKN-1.

Figure 4:
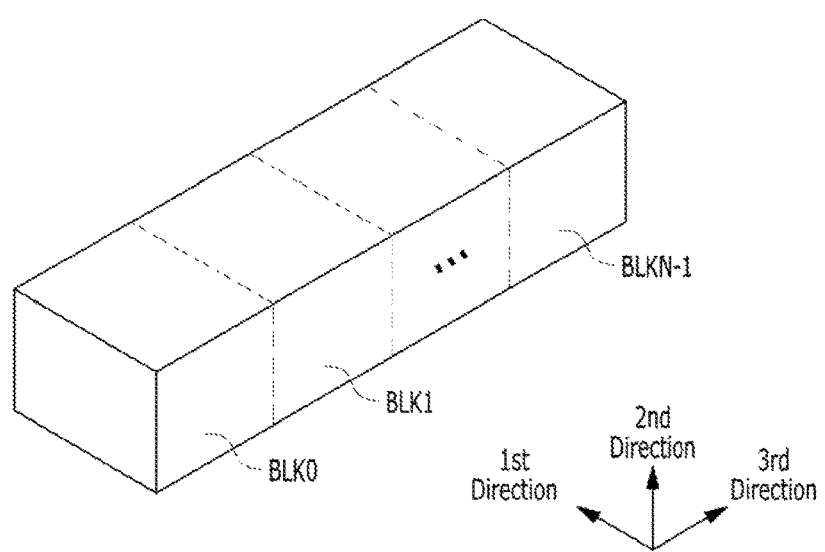
FIG. 4 is a diagram illustrating an exemplary configuration of a memory device, according to an exemplary embodiment of the present invention.

FIG. 4 is a diagram illustrating that the memory blocks of the memory device 150 shown in FIG. 3, and the memory blocks BLK0 to BLKN-1 may be realized as a 3-dimensional structure (or a vertical structure). For example, the respective memory blocks BLK0 to BLKN-1 may be realized as a 3-dimensional structure by including a structure which extends in first to third directions (for example, the x-axis direction, the y-axis direction and the z-axis direction).

The respective memory blocks BLK0 to BLKN-1 may include a plurality of NAND strings extending in the second direction. The plurality of NAND strings may be arranged along the first and the third directions at regular intervals. Each NAND string may be electrically coupled to a bit line, at least one drain select line, at least one source select line, a plurality of word lines, at least one dummy word line, and a common source line. Namely, the respective memory blocks BLK0 to BLKN-1 may be electrically coupled to a plurality of bit lines, a plurality of drain select lines, a plurality of source select lines, a plurality of word lines, a plurality of dummy word lines, and a plurality of common source lines.

Figure 5:
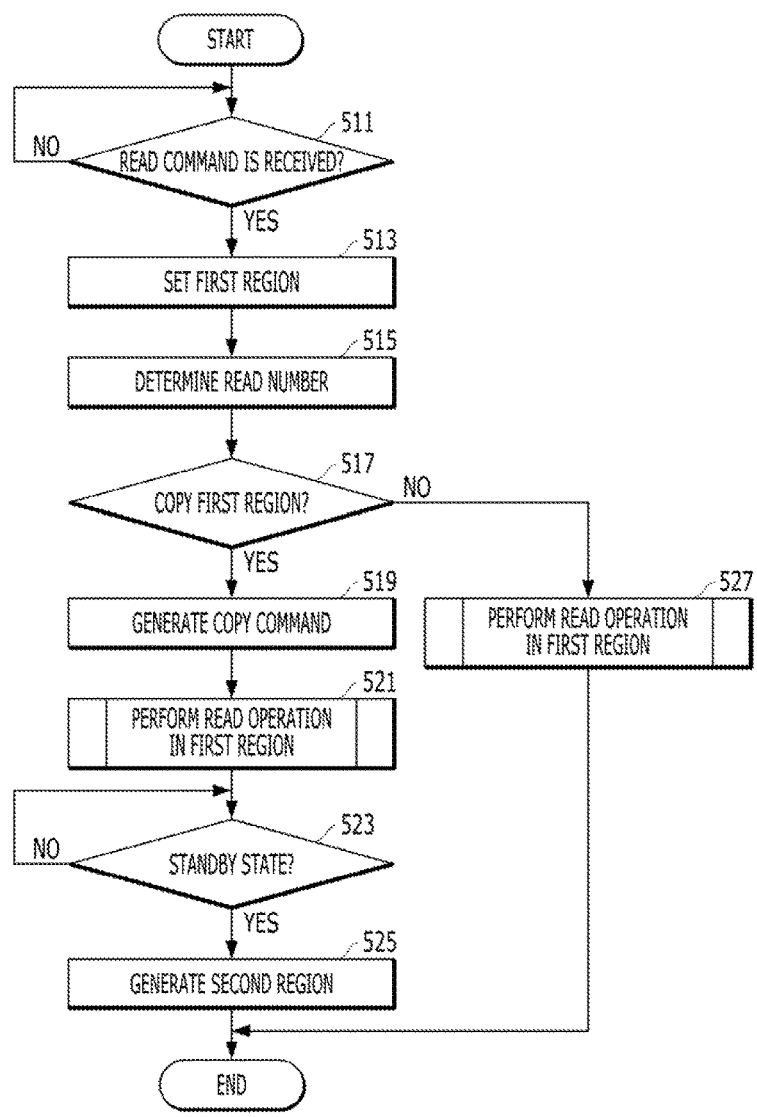
FIG. 5 is a diagram illustrating an operating method of a memory system, according to an exemplary embodiment of the present invention.

FIG. 5 is a flowchart illustrating an operating method of a memory system in accordance with an embodiment.

Referring to FIG. 5, the operating method of the memory system 110 may start with step 511 at which controller 130 receives a read command from host 102. For example, when the read command of the host 102 is received through the host interface unit 132, a processor 134 may sense the read command. The read command may include address information of the data to be read. For example, the address information may include a logical address of the data.

Then, the controller 130 may set a first region corresponding to the read command at step 513. For example, the processor 134 may determine the first region in which data to be read by the memory device 150 are written, based on the logical address information of the read command. The processor 134 may then determine a physical address corresponding to the logical address of the data, based on a previously stored map table that correlates logical addresses with physical addresses. The physical address of the data may indicate one or more blocks and one or more pages in which data are written. The processor 134 may determine the physical address of the data based on the map table. Through this operation, the processor 134 may set the first region to be a block and page corresponding to the physical address of the data.

In accordance with an exemplary embodiment, the first region may include one or more primary regions and one or more secondary regions. The primary region may be a region where data are primarily written in the memory device 150 through a general write operation. That is, the primary region may be a region where data applied from the host 102 are written according to a write request from the host 102. The secondary region may indicate a region where data copied from the memory device 150 are written. That is, the secondary region may indicate a region where data having been stored first in the memory device 150 are then copied and written by a control operation of the controller 130. For example, the logical address of the data in the map data may correspond to at least one of the physical addresses of the primary region and the secondary region. The secondary region may be generated from the primary region, and the physical address of the primary region may be different from the physical address of the secondary region. When the first region includes a plurality of secondary regions, any one of the secondary regions may be generated from another secondary region, and the physical addresses of the secondary regions may be different from each other.

The controller 130 may determine a read number in the first region at step 515. The read number may be determined from a value obtained by counting the number of read operations performed in the first region. For example, the read number may be determined on a block or page basis. The processor 134 may set the counting value to the read number. Alternatively, the processor 134 may calculate the read number, based on the counting value. For example, the processor 134 may calculate the read number as expressed in Equations 1 and 2 below.

$$RN=(C \times W_R/\text{Block Size})/\text{BANK} \quad \text{[Equation 1]}$$

$$\text{BANK}=\text{DIE} \times \text{PLANE} \times \text{BLOCK} \quad \text{[Equation 2]}$$

In Equations 1 and 2, RN represents the read number, C represents the memory capacity of the memory device 150, $W_R$ represents the ratio of read operations under a workload based on read and write operations corresponding to the first region, Block Size represents the size of a block in the memory device 150, BANK represents the product of the number of dies, the number of planes, and the number of blocks in the memory device 150.

For example, when the ratio of read operations to write operations at a workload corresponding to the first region is 6:4, the read number may be calculated as 4,915 as expressed in Equation 3 below. Here, the memory capacity of the memory device 150 may be set to 1,024 GB, the size of a block in the memory device 150 may be set to 4 KB, and the numbers of dies, planes and blocks in the memory device 150 may be set to 8, 2 and 1,024, respectively. For example, when the ratio of read operations to write operations at the workload corresponding to the first region is 9:1, the read number may be calculated as 58,983 as expressed in Equation 4 below. Here, the memory capacity of the memory device 150 may be set to 1,024 GB, the size of a block in the memory device 150 may be set to 4 KB, and the numbers of dies, planes and blocks in the memory device 150 may be set to 4, 2 and 1,024, respectively. Furthermore, when the ratio of read operations to write operations at the workload corresponding to the first region is 99:1, the read number may be calculated as 129,762 as expressed in Equation 5 below. Here, the memory capacity of the memory device 150 may be set to 1,024 GB, the size of a block in the memory device 150 may be set to 4 KB, and the numbers of dies, planes and blocks in the memory device 150 may be set to 1, 2 and 1,024, respectively.

$$4{,}915=(1024 \text{ GB} \times 60\%/4 \text{ KB})/(8 \times 2 \times 1024) \quad \text{[Equation 3]}$$

$$58{,}983=(1024 \text{ GB} \times 90\%/4 \text{ KB})/(4 \times 2 \times 1024) \quad \text{[Equation 4]}$$

$$129{,}762=(1024 \text{ GB} \times 99\%/4 \text{ KB})/(1 \times 2 \times 1024) \quad \text{[Equation 5]}$$

In accordance with an exemplary embodiment, the first region may include one or more primary regions and one or more secondary regions. When the first region includes the primary and secondary regions, the processor 134 may determine read numbers of the primary and secondary regions. For example, there exist counting values corresponding to the primary and secondary regions. Based on the counting values, the processor 134 may determine the respective read numbers of the primary and secondary regions. When the first region includes a plurality of secondary regions, the processor 134 may determine a read number of each of the secondary regions. For example, there exist counting values corresponding to the respective secondary regions. Based on the counting values, the processor 134 may determine the respective read numbers of the secondary regions.

Based on the read number, the controller 130 may determine whether to copy the first region, at step 517. For this operation, the processor 134 may compare the read number to a predetermined threshold number. For example, the processor 134 may determine whether the read number is equal to or greater than the threshold number. The threshold number may be decided by a limit number at which a read operation is expected to be disturbed. The threshold number may be set to be equal or smaller than the limit number but in any event no greater than the limit number. The threshold number may be set to be smaller than the limit number to provide a safe margin. Hence, if the read number exceeds the limit number, a read operation may be disturbed in the first region. In this case, an error may occur in the read operation. The limit number may differ depending on the number of cycles, which is decided by program and erase operations (P/E cycles) in the first region. That is, the limit number may be set differently depending on the number of cycles.

The threshold number may be decided by the limit number and margin depending on the cycle number of the first region as shown in Table 1 below. For example, when the cycle number is equal to or less than 0.1 k, the threshold number may be set to 80% of 310 k, i.e. 217 k. Furthermore, when the cycle number is more than 0.1 k and equal to or less than 0.5 k, the threshold number may be set to 80% of 271 k, i.e. 190 k. In this way, when the cycle number is more than 6.0 k and equal to or less than 7.0 k, the threshold number may be set to 70% of 30 k, i.e. 21 k. In this case, when the read number is 4,915, the processor 134 may determine to not copy the first region. This is because the read number is smaller than the threshold number, regardless of the cycle number of the first region. Furthermore, when the read number of 58,983, the processor 134 may determine to read the first region in case where the cycle number of the first region is 4.0 k. Furthermore, for a read number of 129,762, the processor 134 may determine to copy the first region when the cycle number of the first region is 2.0 k.

TABLE 1

| Cycle number (k) | Limit number (k) | Margin (%) |
| --- | --- | --- |
| 0.1 | 310 | 30 |
| 0.5 | 271 | 30 |
| 1.0 | 228 | 30 |
| 2.0 | 163 | 30 |
| 3.0 | 116 | 30 |
| 4.0 | 82 | 30 |
| 5.0 | 59 | 30 |
| 6.0 | 42 | 30 |
| 7.0 | 30 | 30 |

In accordance with an exemplary embodiment, the first region may include one or more primary regions and one or more secondary regions. When the first region includes the primary and secondary regions, the processor 134 may determine whether to copy each of the primary and secondary regions. The processor 134 may compare a read number of each of the primary and secondary regions to the threshold number. When the first region includes a plurality of secondary regions, the processor 134 may determine whether to copy each of the secondary regions. The processor 134 may compare a read number of each of the secondary regions to the threshold number.

When determining to copy the first region at step 517 (YES at step 517), the controller 130 may generate a copy command for copying the first region at step 519. For example, the controller 130 may include a work queue for storing the various commands received from the host 102 and scheduling the order of execution of the stored commands. The work queue may be disposed in any one of the processor 134, the NFC 142 and the memory 144. The processor 134 may input a copy command to the work queue.

In accordance with an exemplary embodiment, the first region may include one or more primary regions and one or more secondary regions. When the first region includes the primary and secondary regions, the processor 134 may generate a copy command for copying one or more of the primary and secondary regions. When the first region includes a plurality of secondary regions, the processor 134 may generate a copy command for copying one or more of the secondary regions.

Subsequently, the controller 130 may perform a read operation in the first region at step 521. For example, the processor 134 may provide data of the first region to the host 102. The processor 134 may increase the read number of the first region by 1.

In accordance with an exemplary embodiment, the first region may include one or more primary regions and one or more secondary regions. When the first region includes the primary and secondary regions, the processor 124 may alternately perform a read operation on the primary and secondary regions. For example, when a read operation was performed on the primary region in response to a previous read command from the host 102, the processor 134 may perform a read operation on the secondary region in response to a current read command from the host 102. Alternatively, when a read operation was performed on the secondary region in response to a previous read command from the host 102, the processor 134 may perform a read operation on the primary region in response to a current read command from the host 102. Furthermore, the processor 134 may indicate on which of the primary and secondary regions the read operation was performed, in response to the current read command. When the first region includes a plurality of secondary regions, the processor 134 may alternately perform a read operation on the secondary regions. For example, when a read operation was performed on any one of the secondary regions in response to a previous read command from the host 102, the processor 134 may perform a read operation on another of the secondary regions in response to a current read command from the 102. The processor 134 may indicate on which of the secondary regions the read operation was performed, in response to the current read command.

Figure 6:
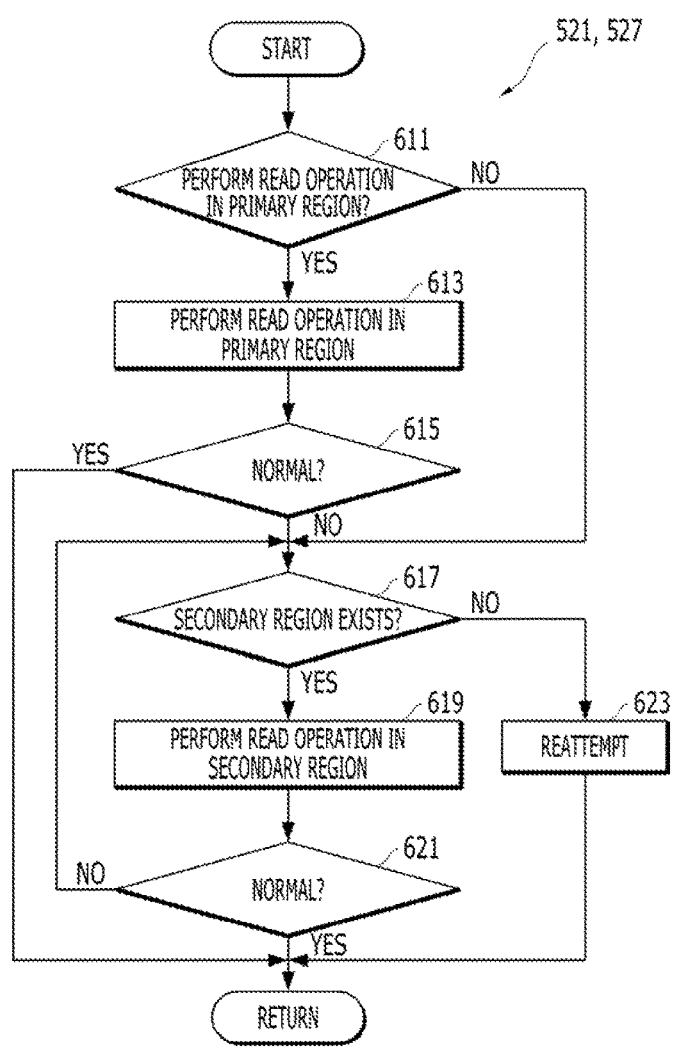
FIG. 6 is a diagram illustrating a read operation in a first region of FIG. 5.

FIG. 6 is a flowchart illustrating a read operation in the first region in FIG. 5.

Referring to FIG. 6, the processor 134 may determine whether to perform a read operation on the primary region, at step 611. For example, the processor 134 may check on which of the primary and secondary regions a read operation was performed, in response to the previous read command. When it is checked that the read operation was performed on the secondary region in response to the previous read command, the processor 134 may determine to perform the current read operation on the primary region. When it is checked that the read operation was performed on the primary region in response to the previous read command, the processor 134 may determine to perform the current read operation on the secondary region.

When determining to perform a read operation on the primary region at step 611 (YES at step 611), the processor 134 may perform a read operation on the primary region at step 613. For example, the processor 134 may provide data of the primary region to the host 102. The processor 134 may increase the read number of the primary region by 1.

The processor 134 may determine whether the read operation in the primary region is normally performed, at step 615. For example, the processor 134 may determine whether an error occur during the read operation in the primary region. For example, error correction information may be stored in a spare region of the memory device 150. Based on the error correction information, the processor 134 may correct an error. The error correction operation of the processor may succeed or fail. For example, when no error is determined or the error correction operation succeeds, the processor 134 may determine that the read operation was normally performed (Yes at step 615). On the other hand, when the error correction operation fails, the processor 134 may determine that the read operation was not normally performed (NO at step 615).

When it is determined at step 615 that the read operation in the primary region was normally performed, the processor 134 may return to FIG. 5.

When it is determined at step 611 that a read operation does not need to be performed on the primary region (NO at step 611), the processor 134 may determine whether a secondary region exists, at step 617. Furthermore, when it is determined at step 615 that the read operation in the primary region was not normally performed (NO at step 615), the processor 134 may determine whether a secondary region exists, at step 617. For example, the processor 134 may determine whether the first region includes both of the primary region and the secondary region. When the first region includes a plurality of secondary regions, the processor 134 may set any one of the secondary regions. For example, the secondary regions may have priorities depending on the generation order thereof, and the processor 134 may set any one of the secondary regions according to the priorities.

When it is determined at step 617 that a secondary region exists (YES at step 617), the processor 134 may perform a read operation on the secondary region at step 619. For example, the processor 134 may provide data of the secondary region to the host 102. The processor 134 may increase the read number of the secondary region by 1.

The processor 134 may determine whether the read operation in the secondary region is normally performed, at step 621. For example, the processor 134 may determine whether an error occur during the read operation of the secondary region. Since the processor 134 can be operated in a similar manner to the operation of step 615, the detailed descriptions thereof are omitted herein.

When it is determined at step 621 that the read operation in the secondary region was normally performed (YES at step 621), the processor 134 may return to FIG. 5.

When it is determined at step 621 that the read operation in the secondary region was rot normally performed (NO AT STEP 621), the processor 134 may return to step 617. For example, the processor 134 may determine whether additional secondary regions exist. When the first region includes a plurality of secondary regions, the processor 134 may set another secondary region among the secondary regions. For example, the processor 134 may set another secondary region among the secondary regions according to the priorities. That is, the processor 134 may set another secondary region having a lower primary than the previously set secondary region.

When it is determined at step 617 that the secondary region does not exist (NO at step 617), the processor 134 may reattempt a read operation at step 623. For example, when a read operation was not normally performed in the primary region, the processor 134 may reattempt a read operation on the primary region. Alternatively, when a read operation was not normally performed in the secondary region, the processor 134 may reattempt a read operation on the secondary region. The read operation may be normally performed or not. Thus, the processor 134 may reattempt a preset number of read operations. Then, the processor 134 may return to FIG. 5. For example, regardless of whether the read operation is normally performed, the processor 134 may return to FIG. 5.

Finally, when the memory device is switched to a standby state, the controller 130 may determine the standby state at step 523. The standby state may be defined as a state in which no commands are received from the host 102. In response to the standby state, the controller 130 may generate a second region in the memory device 150 at step 525. For example, according to scheduling of the work queue, the processor 134 may generate the second region in the memory device 150, based on the copy command. For this operation, the processor 134 may decide a second region to which the data of the first region are to be written, in the memory device 150. The size of the second region may be set to the same size as the first region. The processor 134 may decide a second region in a block different from the block of the first region in the memory device 150. The processor 134 may write data of the first region in the second region. The second region may be added as a secondary region of the first region.

When it is determined at step 517 that the first region does not need to be copied (NO at step 517), the controller 130 may perform a read operation on the first region, at step 527. Since the controller 130 is operated in a similar manner to the operation of step 521, the detailed descriptions thereof are omitted herein. Furthermore, the processor 134 may be operated in a similar manner to FIG. 6.

Hereinbelow, descriptions will be made with reference to FIGS. 7 to 12, for a data processing system and electronic appliances to which the memory system 110 including the memory device 150 and the controller 130 described above with reference to FIGS. 1 to 6, according to the embodiment, is applied.

Figure 7:
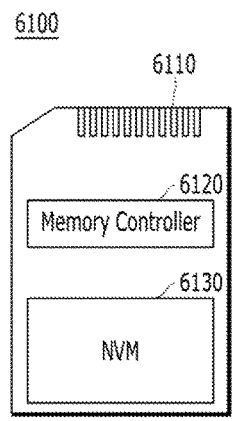
FIGS. 7 to 12 are diagrams illustrating examples of memory systems, according to exemplary embodiments of the present invention.

FIG. 7 is a diagram illustrating a data processing system including the memory system according to an embodiment. FIG. 7 is a drawing illustrating a memory card system 6100 to which the memory system according to an embodiment is applied.

Referring to FIG. 7, a memory card system 6100 may include a memory controller 6120, a memory device 6130, and a connector 6110.

The memory controller 6120 may be connected with the memory device 6130 and may access the memory device 6130. In some embodiments, the memory device 6130 may be implemented with a nonvolatile memory (NVM). For example, the memory controller 6120 may control read, write, erase and background operations for the memory device 6130. The memory controller 6120 may provide an interface between the memory device 6130 and a host (not shown), and may drive a firmware for controlling the memory device 6130. For example, the memory controller 6120 may correspond to the controller 130 in the memory system 110 described above with reference to FIG. 1, and the memory device 6130 may correspond to the memory device 150 in the memory system 110 described above with reference to FIG. 1.

Therefore, the memory controller 6120 may include components such as a random access memory (RAM), a processing unit, a host interface, a memory interface and an error correction unit as shown in FIG. 1.

The memory controller 6120 may communicate with an external device (for example, the host 102 described above with reference to FIG. 1), through the connector 6110. For example, as described above with reference to FIG. 1, the memory controller 6120 may be configured to communicate with the external device through at least one of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (ESDI), Integrated Drive Electronics (IDE), Firewire, universal flash storage (UFS), wireless-fidelity (WI-FI) and Bluetooth. Accordingly, the memory system and the data processing system according to the embodiment may be applied to wired/wireless electronic appliances, for example, a mobile electronic appliance.

The memory device 6130 may be implemented with a nonvolatile memory (NVM). For example, the memory device 6130 may be implemented with various nonvolatile memory devices such as an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-MRAM).

The memory controller 6120 and the memory device 6130 may be integrated into a single semiconductor device. For example, the memory controller 6120 and the memory device 6130 may construct a solid state driver (SSD) by being integrated into a single semiconductor device. The memory controller 6120 and the memory device 6130 may construct a memory card such as a PC card (Personal Computer Memory Card International Association; PCM-CIA), a compact flash card (CF), a smart media card (SM and SMC), a memory stick, a multimedia card (MMC, RS-MMC, MMCmicro and eMMC), an SD card (e.g. SD, miniSD, microSD and SDHC) and a universal flash storage (UFS).

Figure 8:
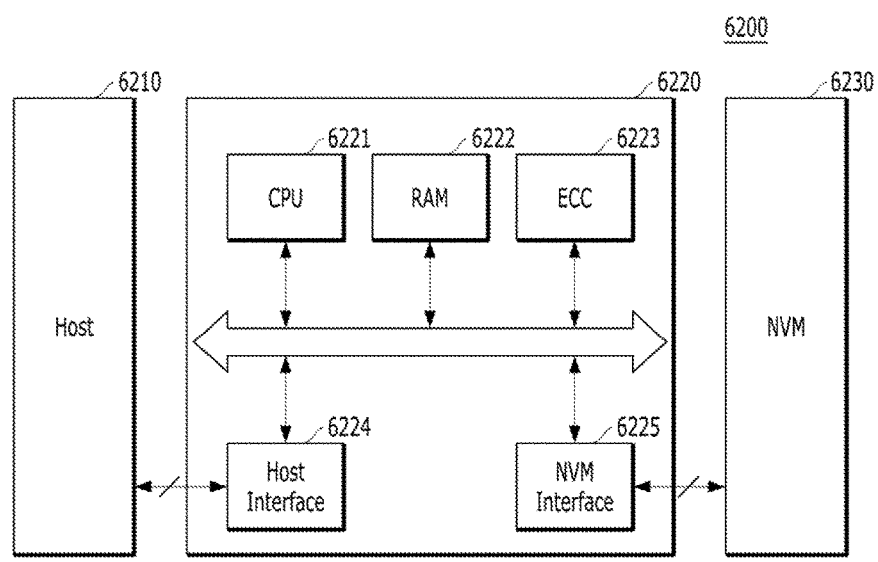

FIG. 8 is a diagram illustrating an example of a data processing system 6200 including a memory system according to an exemplary embodiment of the present invention.

Referring to FIG. 8, a data processing system 6200 may include a memory device 6230 which may be implemented with at least one nonvolatile memory (NVM) and a memory controller 6220 for controlling the memory device 6230. The data processing system 6200 may be a storage medium such as a memory card (e.g., CF, SD and microSD), as described above with reference to FIG. 1. The memory device 6230 may correspond to the memory device 150 in the memory system 110 described above with reference to FIG. 1, and the memory controller 6220 may correspond to the controller 130 in the memory system 110 described above with reference to FIG. 1.

The memory controller 6220 may control the operations, including the read, write and erase operations for the memory device 6230 in response to requests received from a host 6210. The memory controller 6220 may include a central processing unit (CPU) 6221, a random access memory (RAM) as a buffer memory 6222, an error correction code (ECC) circuit 6223, a host interface 6224, and an NVM interface as a memory interface 6225, all coupled via an internal bus.

The CPU 6221 may control the operations for the memory device 6230 such as read, write, file system management, bad page management, and so forth. The RAM 6222 may operate according to control of the CPU 6221 and may be used as a work memory, a buffer memory, a cache memory, or the like. In the case where the RAM 6222 is used as a work memory, data processed by the CPU 6221 may be temporarily stored in the RAM 6222. In the case where the RAM 6222 is used as a buffer memory, the RAM 6222 may be used to buffer data to be transmitted from the host 6210 to the memory device 6230 or from the memory device 6230 to the host 6210. In the case where the RAM 6222 is used as a cache memory, the RAM 6222 may be used to enable the memory device 6230 with a low speed to operate at a high speed.

The ECC circuit 6223 may correspond to the ECC unit 138 of the controller 130 described above with reference to FIG. 1. As described above with reference to FIG. 1 the ECC circuit 6223 may generate an error correction code (ECC) for correcting a fail bit or an error bit in the data received from the memory device 6230. The ECC circuit 6223 may perform error correction encoding for data to be provided to the memory device 6230, and may generate data added with parity bits. The parity bits may be stored in the memory device 6230. The ECC circuit 6223 may perform error correction decoding for data outputted from the memory device 6230. For example, the ECC circuit 6223 may correct errors by using the parity bits. For example, as described above with reference to FIG. 1, the ECC circuit 6223 may correct errors by using various coded modulations such as of a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM) and a Block coded modulation (BCM).

The memory controller 6220 may transmit and receive data to and from the host 6210 through the host interface 6224, and transmit and receive data to and from the memory device 6230 through the NVM interface 6225. The host interface 6224 may be connected with the host 6210 through at least one of various interface protocols such as a parallel advanced technology attachment (DATA) bus, a serial advanced technology attachment (SATA) bus, a small computer system interface (SCSI), a universal serial bus (USB), a peripheral component interconnection express (PCIe) or a NAND interface. Further, as a wireless communication function or a mobile communication protocol such as wireless fidelity (WI-FI) or long term evolution (LTE) is realized, the memory controller 6220 may transmit and receive data by being connected with an external device such as the host 6210 or another external device other than the host 6210. Specifically, as the memory controller 6220 is configured to communicate with an external device through at least one among various communication protocols, the memory system and the data processing system according to the embodiment may be applied to wired/wireless electronic appliances, for example, a mobile electronic appliance.

Figure 9:
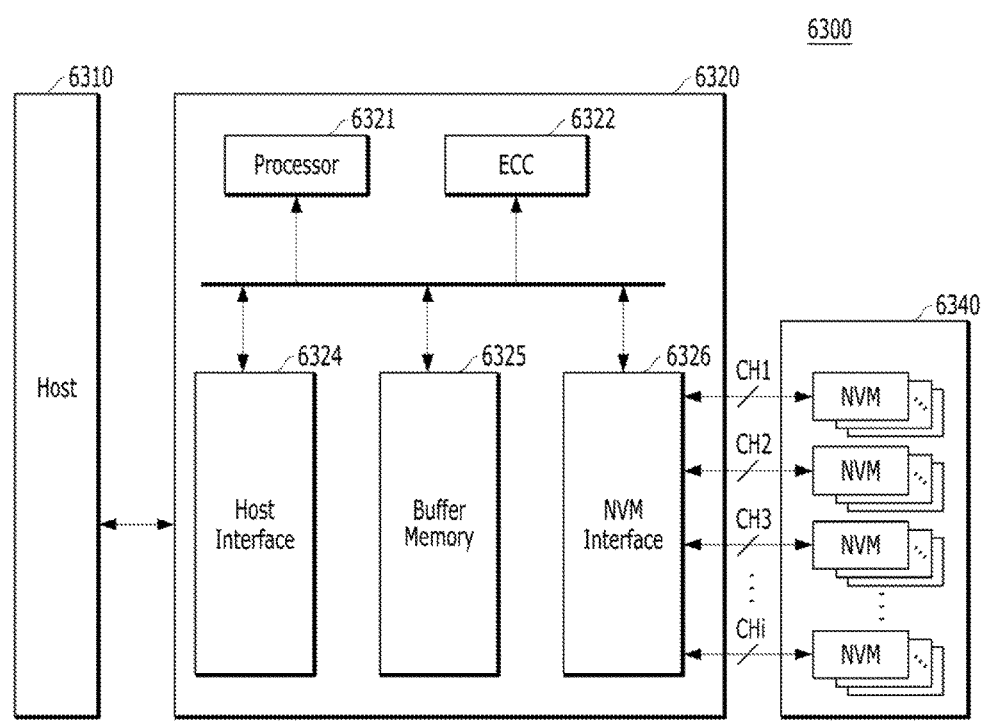

FIG. 9 is a diagram illustrating an example of a data processing system including a memory system according to an exemplary embodiment of the invention. The data processing system of FIG. 9 may be a solid state drive (SSD) 6300.

Referring to FIG. 9, an SSD 6300 may include a memory device 6340 which may include a plurality of nonvolatile memories NVW, and a controller 6320. The controller 6320 may correspond to the controller 130 in the memory system 110 described above with reference to FIG. 1, and the memory device 6340 may correspond to the memory device 150 in the memory system 110 described above with reference to FIG. 1.

The controller 6320 may be connected with the memory device 6340 through a plurality of channels CH1 CH2, CH3, . . . and CHi. The controller 6320 may include a processor 6321, a buffer memory 6325, an error correction code (ECC) circuit 6322, a host interface 6324, and a nonvolatile memory (NVM) interface as a memory interface 6326 coupled via an internal bus.

The buffer memory 6325 may temporarily store data received from a host 6310 or data received from a plurality of nonvolatile memories NVMs included in the memory device 6340, or temporarily store metadata of the plurality of nonvolatile memories NVMs. For example, the metadata may include map data including mapping tables. The buffer memory 6325 may be implemented with a volatile memory such as, but not limited to, a dynamic random access memory (DRAM), a synchronous dynamic random access memory (SDRAM) a double data rate (DDR) SDRAM, a low power double data rate (LPDDR) SDRAM and a graphic random access memory (GRAM) or a nonvolatile memory such as, but not limited to, a ferroelectric random access memory (FRAM), a resistive random access memory (ReRAM), a spin-transfer torque magnetic random access memory (STT-MRAM) and a phase change random access memory (PRAM). While it is illustrated in FIG. 9, for the sake of convenience in explanation, that the buffer memory 6325 is disposed inside the controller 6320, it is to be noted that the buffer memory 6325 may be disposed outside the controller 6320.

The ECC circuit 6322 may calculate error correction code values of data to be programmed in the memory device 6340 in a program operation, perform an error correction operation for data read from the memory device 6340, based on the error correction code values, in a read operation, and perform an error correction operation for data recovered from the memory device 6340 in a recovery operation for failed data.

The host interface 6324 may provide an interface function with respect to an external device such as the host 6310. The nonvolatile memory interface 6326 may provide an interface function with respect to the memory device 6340 which is connected through the plurality of channels CH1, CH2, CH3, . . . and CHi.

As a plurality of SSDs 6300 to each of which the memory system 110 described above with reference to FIG. 1 is applied are used, a data processing system such as a redundant array of independent disks (RAID) system may be implemented. In the RAID system, the plurality of SSDs 6300 and an RAID controller for controlling the plurality of SSDs 6300 may be included. In the case of performing a program operation by receiving a write command from the host 6310, the RAID controller may select at least one memory system (for example, at least one SSD 6300) in response to the RAID level information of the write command received from the host 6310, among a plurality of RAID levels (for example, the plurality of SSDs 6300) and may output data corresponding to the write command, to the selected SSD 6300. In the case of performing a read operation by receiving a read command from the host 6310, the RAID controller may select at least one memory system (for example, at least one SSD 6300) in response to the RAID level information of the write command received from the host 6310, among the plurality of RAID levels (for example, the plurality of SSDs 6300), and may provide data outputted from the selected SSD 6300, to the host 6310.

Figure 10:
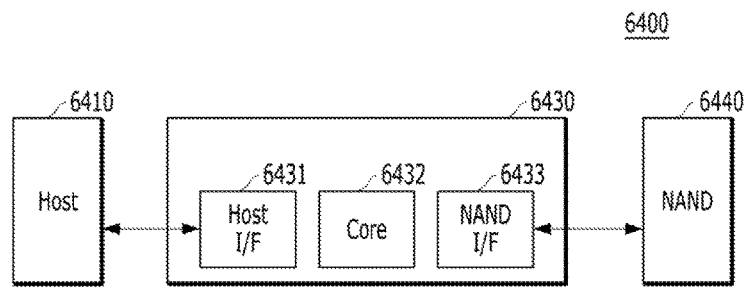

FIG. 10 is a diagram illustrating another example of a data processing system including the memory system according to an exemplary embodiment of the present invention. FIG. 10 is a drawing illustrating an embedded multimedia card eMMC) 6400 to which a memory system according to an embodiment is applied.

Referring to FIG. 10, an eMMC 6400 may include a memory device 6440 which is implemented with at least one NAND flash memory, and a controller 6430. The controller 6430 may correspond to the controller 130 in the memory system 110 described above with reference to FIG. 1, and the memory device 6440 may correspond to the memory device 150 in the memory system 110 described above with reference to FIG. 1.

The controller 6430 may be connected with the memory device 6440 through a plurality of channels. The controller 6430 may include a core 6432, a host interface 6431, and a memory interface such as a NAND interface 6433.

The core 6432 may control the operations of the eMMC 6400. The host interface 6431 may provide an interface function between the controller 6430 and a host 6410. The NAND interface 6433 may provide an interface function between the memory device 6440 and the controller 6430. For example, the host interface 6431 may be a parallel interface such as an MMC interface, as described above with reference to FIG. 1, or a serial interface such as an ultra-high speed class 1 (UHS-I)/UHS class 2 (UHS-II) and a universal flash storage (UFS) interface.

Figure 11:
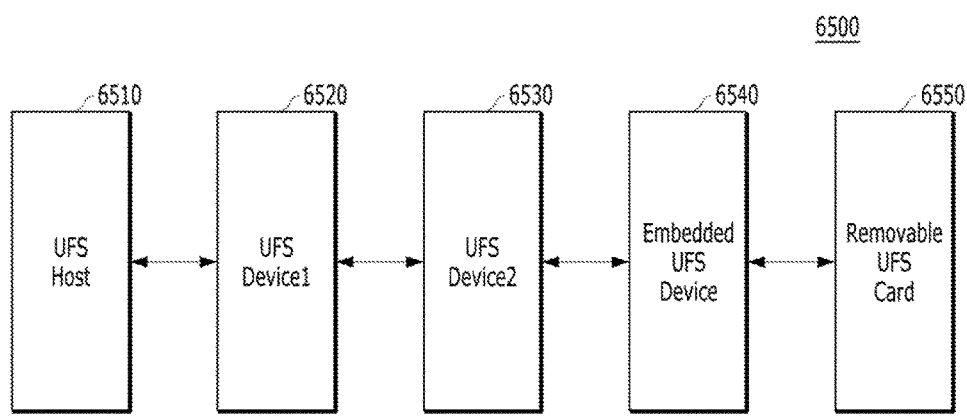

FIG. 11 is a diagram illustrating another example of a data processing system including a memory system according to an exemplary embodiment of the present invention. FIG. 11 is a drawing illustrating a universal flash storage (UFS) system 6500 to which the memory system according to the embodiment is applied.

Referring to FIG. 11, a UFS system 6500 may include a UFS host 6510, a plurality of UFS devices 6520 and 6530, an embedded UFS device 6540, and a removable UFS card 6550. The UFS host 6510 may be an application processor of wired/wireless electronic appliances, for example, a mobile electronic appliance.

The UFS host 6510 the UFS devices 6520 and 6530, the embedded UFS device 6540 and the removable UFS card 6550 may respective y communicate with external devices such as wed/wireless electronic appliances (for example, a mobile electronic appliance), through a UFS protocol. The UFS devices 6520 and 6530, the embedded UFS device 6540 and the removable UFS card 6550 may be implemented with the memory system 110 described above with reference to FIG. 1, for example, as the memory card system 6100 described above with reference to FIG. 7. The embedded UFS device 6540 and the removable UFS card 6550 may communicate through another protocol other than the UFS protocol. For example, the embedded UFS device 6540 and the removable UFS card 6550 may communicate through various card protocols such as, but not limited to, USB flash drives (UFDs), multimedia card (MMC), secure digital (SD), mini SD and Micro SD.

Figure 12:
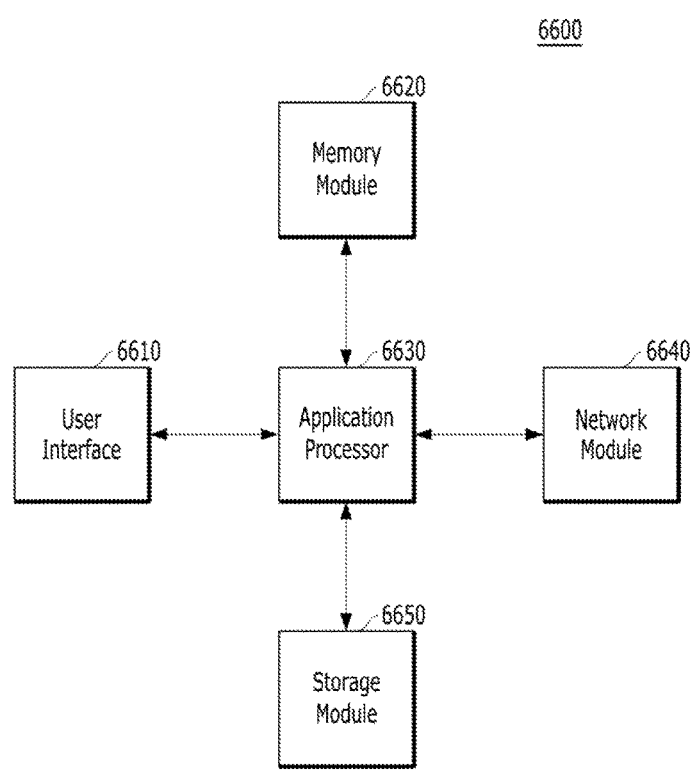

FIG. 12 is a diagram illustrating an example of a data processing system including the memory system according to an exemplary embodiment of the present invention. FIG. 12 is a drawing illustrating a user system 6600 to which the memory system according to the embodiment is applied.

Referring to FIG. 12, a user system 6600 may include an application processor 6630, a memory module 6620, a network module 6640, a storage module 6650, and a user interface 6610.

The application processor 6630 may drive components included in the user system 6600 and an operating system (OS). For example, the application processor 6630 may include controllers for controlling the components included in the user system 6600, interfaces, graphics engines, and so on. The application processor 6630 may be provided by a system-on-chip (SoC).

The memory module 6620 may operate as a main memory, a working memory, a buffer memory or a cache memory of the user system 6600. The memory module 6620 may include a volatile random access memory such as a dynamic random access memory (DRAM), a synchronous dynamic random access memory (SDRAM), a double data rate (DDR) SDRAM, a DDR2 SDRAM, a DDR3 SDRAM, a low power double data rate (LPDDR) SDRAM, an LPDDR2 SDRAM and an LPDDR3 SDRAM or a nonvolatile random access memory such as a phase change random access memory (PRAM), a resistive random access memory (ReRAM), a magnetic random access memory (MRAM) and a ferroelectric random access memory (FRAM). For example, the application processor 6630 and the memory module 6620 may be mounted by being packaged on the basis of a package-on-package (POP).

The network module 6640 may communicate with external devices. For example, the network module 6640 may support not only wired communications but also various wireless communications such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI), and so on, and may thereby communicate with wired/wireless electronic appliances, for example, a mobile electronic appliance. According to this fact, the memory system and the data processing system according to the embodiment may be applied to wired/wireless electronic appliances. The network module 6640 may be included in the application processor 6630.

The storage module 6650 may store data such as data received from the application processor 6530, and transmit data stored therein, to the application processor 6530. The storage module 6650 may be realized by a nonvolatile semiconductor memory device such as a phase-change RAM (PRAM), a magnetic RAM (MRAM), a resistive RAM (ReRAM), a NAND flash memory, a NOR flash memory and a 3-dimensional NAND flash memory. The storage module 6650 may be provided as a removable storage medium such as a memory card of the user system 6600 and an external drive. For example, the storage module 6650 may correspond to the memory system 110 described above with reference to FIG. 1, and may be implemented with the SSD, eMMC and UFS described above with reference to FIGS. 9 to 11.

The user interface 6610 may include interfaces for inputting data or commands to the application processor 6630 or for outputting data to an external device. For example, the user interface 6610 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, a light emitting diode (LED), a speaker and a motor.

In the case where the memory system 110 described above with reference to FIG. 1 is applied to the mobile electronic appliance of the user system 6600 according to an embodiment, the application processor 6630 may control the operations of the mobile electronic appliance, and the network module 6640 as a communication module may control wired/wireless communication with an external device, as described above. The user interface 6610 as the display/touch module of the mobile electronic appliance displays data processed by the application processor 6630 or supports input of data from a touch panel.

In accordance with the various embodiments based on the number of read operations performed in a specific region of the memory device, the memory system may copy data of the corresponding region into another region of the memory device. Thus, the memory system may read data from another region as well as the corresponding region. That is, when a read operation in the corresponding region of the memory device is not normally performed, the memory system may perform a read operation in another region of the memory device.

Therefore, the various embodiments can minimize the complexity and performance reduction of the memory system, and maximize the use efficiency of the memory device, thereby rapidly and stably processing data to the memory device.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
   a memory device; and
   a controller suitable for controlling the memory device,
   wherein the controller performs read and write operations in a first region of the memory device in response to commands entered from a host, and establishes a second region in the memory device based on a read number of the first region, and
   wherein the second region is for copying data stored in the first region, and
   wherein the read number is obtained by dividing a first value of multiplying a memory capacity of the memory device and a ratio of read operations under a workload based on the read and write operations corresponding to the first region by a block size, then dividing the first value by a second value of multiplying a count of die, a count of planes, and a count of blocks in the memory device.

2. The memory system of claim 1, wherein the controller compares the read number of the first region to a predetermined threshold number, and determines whether to establish the second region.

3. The memory system of claim 2, wherein when the controller determines to set the second region, the controller generates a copy command for copying the data of the first region into the second region.

4. The memory system of claim 3, wherein when the memory device is switched to a standby state, the controller copies the data of the first region into the second region, based on the copy command.

5. The memory system of claim 4, wherein the first region comprises a primary region to which data are written in response to a request from the host or one or more secondary regions to which data are copied and written in response to the copy command.

6. The memory system of claim 5, wherein after the data of the first region are copied into the second region, the controller sets the second region to a secondary region of the first region, and performs the read operation in the primary region of the first region or one or more of the secondary regions of the first region in response to a read command for the first region, the read command being provided from the host.

7. The memory system of claim 2, wherein when the number of read operations performed in the first region is equal to or greater than the threshold number, the controller sets the second region.

8. The memory system of claim 2, wherein the threshold number is set according to the number of program/erase cycles in the first region.

9. The memory system of claim 8, wherein the threshold number is set to be smaller than the limit number at which the read operation for the first region is disturbed.

10. An operating method of a memory system including a memory device, comprising:
performing read and write operations in a first region of the memory device in response to commands entered from a host;
obtaining a read number of the first region by dividing a first value of multiplying a memory capacity of the memory device and a ratio of read operations under a workload based on the read and write operations corresponding to the first region by a block size, then dividing the first value by a second value of multiplying a count of dies, a count of planes, and a count of blocks in the memory device; and
establishing a second region in the memory device based on a read number of the first region, wherein the second region is for copying data stored in the first region.

11. The operating method of claim 10, wherein the establishing the second region comprises comparing the read number of the first region to a predetermined threshold number, and determining whether to establish the second region.

12. The operating method of claim 11, further comprising generating a copy command for copying the data of the first region into the second region, when the setting of the second region is determined at the setting of the second region.

13. The operating method of claim 12, further comprising copying the data of the first region into the second region based on the copy command, when the memory device is switched to a standby state.

14. The operating method of claim 13, wherein the first region comprises a primary region to which data are written in response to a request from the host or one or more of secondary regions to which data are copied and written through the copying of the data.

15. The operating method of claim 14, wherein further comprising setting the second region to a secondary region of the first region, and performing the read operation in the primary region of the first region or one or more of the secondary regions of the first region in response to a read command for the first region, the read command being provided from the host, after the copying of the data.

16. The operating method of claim 11, wherein the establishing the second region comprises setting the second region, when the read number of the first region is equal to or greater than the threshold number.

17. The operating method of claim 11, wherein the threshold number is set according to the number of program/erase cycles in the first region.

18. The operating method of claim 17, wherein the threshold number is set to less than the limit number at which the read operation for the first region is disturbed.

* * * * *